US012794445B2

(12) United States Patent
Omura et al.

(10) Patent No.: US 12,794,445 B2
(45) Date of Patent: Nov. 10, 2026

(54) ACOUSTIC WAVE DEVICE

(71) Applicant: Murata Manufacturing Co., Ltd., Nagaokakyo (JP)

(72) Inventors: Masashi Omura, Nagaokakyo (JP); Hirotsugu Mori, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 98 days.

(21) Appl. No.: 18/925,502

(22) Filed: Oct. 24, 2024

(65) Prior Publication Data

US 2025/0047260 A1 Feb. 6, 2025

Related U.S. Application Data

(63) Continuation of application No. PCT/JP2023/010082, filed on Mar. 15, 2023.

(30) Foreign Application Priority Data

Jun. 22, 2022 (JP) ................................ 2022-100350

(51) Int. Cl.

| | |
|---|---|
| ***H03H 9/205*** | (2006.01) |
| ***H03H 9/02*** | (2006.01) |
| ***H03H 9/56*** | (2006.01) |

(52) U.S. Cl.

CPC ........ *H03H 9/205* (2013.01); *H03H 9/02015* (2013.01); *H03H 9/02102* (2013.01); *H03H 9/568* (2013.01)

(58) Field of Classification Search

CPC ............... H03H 9/205; H03H 9/02015; H03H 9/02102; H03H 9/568

See application file for complete search history.

(56) References Cited

U.S. PATENT DOCUMENTS

2005/0237132 A1 10/2005 Sano et al.
2005/0248238 A1* 11/2005 Yamada ............ H03H 9/02102 310/366

(Continued)

FOREIGN PATENT DOCUMENTS

JP 2005110230 A 4/2005
JP 2005333619 A 12/2005

(Continued)

OTHER PUBLICATIONS

International Search Report in PCT/JP2023/010082, mailed May 30, 2023, 3 pages.

(Continued)

*Primary Examiner* — Samuel S Outten
(74) *Attorney, Agent, or Firm* — Keating & Bennett, LLP

(57) ABSTRACT

An acoustic wave device includes a piezoelectric substrate including a piezoelectric layer including first and second main surfaces opposing each other, a first acoustic wave resonator including a first excitation electrode on the first main surface of the piezoelectric layer and a second excitation electrode on the second main surface, a second acoustic wave resonator sharing the piezoelectric substrate with the first acoustic wave resonator, and including a third excitation electrode provided on the first main surface of the piezoelectric layer and a fourth excitation electrode provided on the second main surface, and a wiring electrode on the first main surface of the piezoelectric layer. The first excitation electrode and the second excitation electrode oppose each other with the piezoelectric layer therebetween. A region of the piezoelectric layer between the first and second excitation electrodes is a first excitation region.

20 Claims, 6 Drawing Sheets

(56) References Cited

U.S. PATENT DOCUMENTS

| | | | | |
|---|---|---|---|---|
| 2019/0115901 | A1* | 4/2019 | Takahashi | H03H 9/02015 |
| 2020/0119716 | A1* | 4/2020 | Kim | H03H 9/568 |
| 2020/0274520 | A1* | 8/2020 | Shin | H03H 9/02125 |
| 2023/0016324 | A1 | 1/2023 | Taniguchi | |

FOREIGN PATENT DOCUMENTS

| | | | |
|---|---|---|---|
| JP | 2006246451 | A | 9/2006 |
| JP | 3940932 | B2 | 7/2007 |
| JP | 2007235304 | A | 9/2007 |
| JP | 2007306210 | A | 11/2007 |
| JP | 2008066792 | A | 3/2008 |
| WO | 2013031650 | A1 | 3/2013 |
| WO | 2021200677 | A1 | 10/2021 |

OTHER PUBLICATIONS

Written Opinion in PCT/JP2023/010082, mailed May 30, 2023, 5 pages.

* cited by examiner

ACOUSTIC WAVE DEVICE

CROSS REFERENCE TO RELATED APPLICATIONS

This application is a Continuation Application of PCT Application No. PCT/JP2023/010082, filed on Mar. 15, 2023, and claims the benefit of priority to Japanese Patent Application No. 2022-100350 filed on Jun. 22, 2022. The entire contents of each application are hereby incorporated herein by reference.

BACKGROUND OF THE INVENTION

1. Field of the Invention

The present invention relates to acoustic wave devices.

2. Description of the Related Art

In the related art, acoustic wave devices are widely used for filters for cellular phones and the like. Japanese Patent No. 3940932 discloses an example of a thin film piezoelectric device as an acoustic wave device. The thin film piezoelectric device has a plurality of thin film piezoelectric resonators. In each thin film piezoelectric resonator, metal electrodes are provided on both surfaces of a piezoelectric film. In thin film piezoelectric resonators adjacent to each other, metal electrodes on one side in respective pairs of the metal electrodes are provided integrally. Thus, the thin film piezoelectric resonators adjacent to each other are electrically connected.

However, in the thin film piezoelectric device described in Japanese Patent No. 3940932, unnecessary waves tend to be coupled between the thin film piezoelectric resonators adjacent to each other. Thus, there is a risk that intensity of the unnecessary waves is increased. Further, since the metal electrodes of both of the thin film piezoelectric resonators are integrally provided, areas of the metal electrodes are increased. Thus, a thermal stress applied from the metal electrode to the piezoelectric film is likely to be large. Thus, there is a risk that the piezoelectric film is damaged or electrical characteristics are deteriorated.

SUMMARY OF THE INVENTION

Example embodiments of the present invention provide acoustic wave devices in each of which an unnecessary wave can be reduced or prevented and a thermal stress can be reduced or prevented.

An example embodiment of an acoustic wave device according to the present invention includes a first acoustic wave resonator including a piezoelectric substrate including a piezoelectric layer including a first main surface and a second main surface opposing each other, a first excitation electrode provided on the first main surface of the piezoelectric layer, and a second excitation electrode provided on the second main surface of the piezoelectric layer, a second acoustic wave resonator sharing the piezoelectric substrate with the first acoustic wave resonator, and including a third excitation electrode provided on the first main surface of the piezoelectric layer and a fourth excitation electrode provided on the second main surface of the piezoelectric layer, and a wiring electrode provided on the first main surface of the piezoelectric layer. The first excitation electrode and the second excitation electrode oppose each other with the piezoelectric layer interposed therebetween, a region of the piezoelectric layer interposed between the first excitation electrode and the second excitation electrode is a first excitation region, the third excitation electrode and the fourth excitation electrode oppose each other with the piezoelectric layer interposed therebetween, a region of the piezoelectric layer interposed between the third excitation electrode and the fourth excitation electrode is a second excitation region, the piezoelectric substrate is provided with one or more acoustic reflectors overlapping the first excitation region and the second excitation region in plan view, each of the first excitation electrode and the third excitation electrode is provided individually, and the wiring electrode connects the first excitation electrode and the third excitation electrode.

According to acoustic wave devices according to example embodiments of the present invention, an unnecessary wave can be reduced or prevented and a thermal stress can be reduced or prevented.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

Hereinafter, the present invention will be clarified by describing example embodiments of the present invention with reference to the drawings.

The example embodiments described in the present specification are merely examples, and partial replacement or combination of configurations is possible between different example embodiments.

Figure 1:
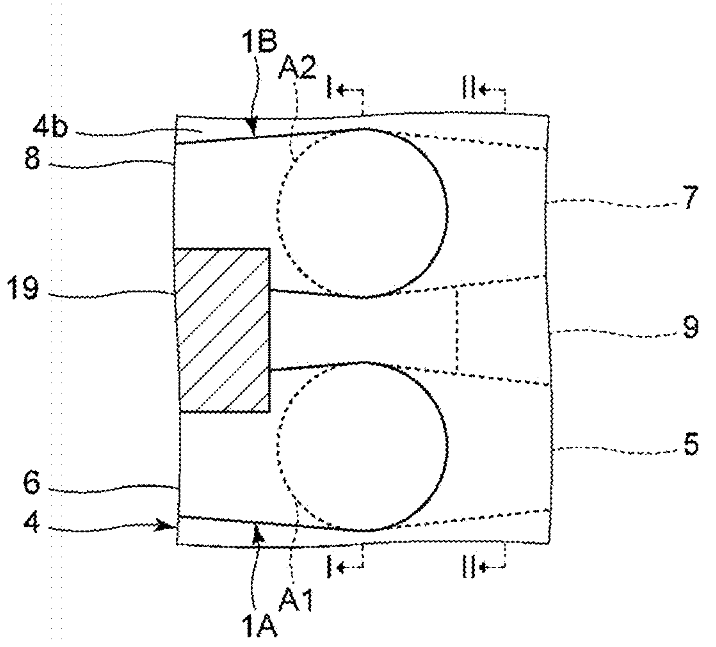
FIG. 1 is a schematic plan view of an acoustic wave device according to a first example embodiment of the present invention.
Figure 2:
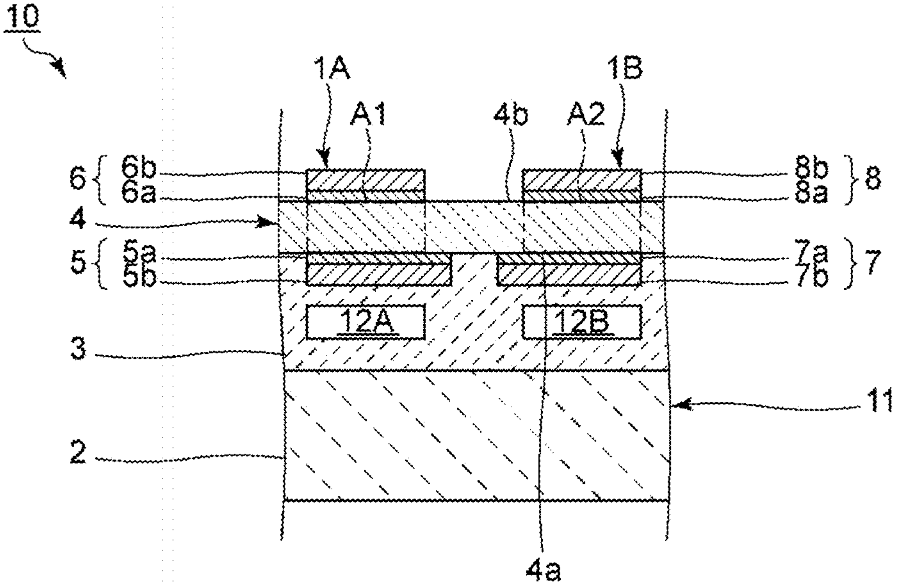
FIG. 2 is a schematic cross-sectional view taken along a line I-I in FIG. 1.
Figure 3:
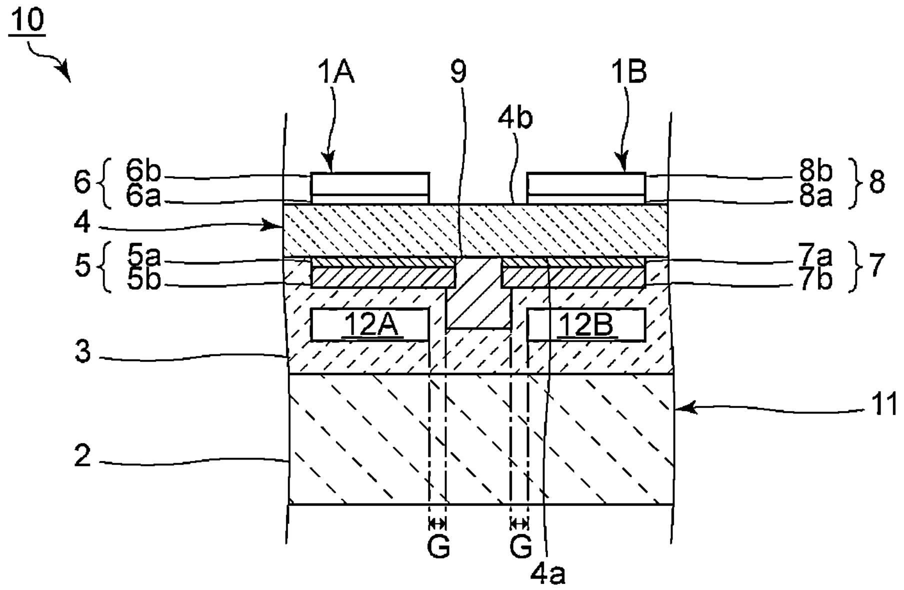
FIG. 3 is a schematic cross-sectional view taken along a line II-II in FIG. 1.

FIG. 1 is a schematic plan view of an acoustic wave device according to a first example embodiment of the present invention. FIG. 2 is a schematic cross-sectional view taken along the line I-I in FIG. 1. FIG. 3 is a schematic cross-sectional view taken along the line II-II in FIG. 1. Note that in FIG. 1, one of wiring electrodes described later is indicated by hatching.

As illustrated in FIG. 1, an acoustic wave device 10 of the present example embodiment preferably includes a first acoustic wave resonator 1A and a second acoustic wave resonator 1B. The acoustic wave device 10 is an acoustic wave device defining a filter device. More specifically, the filter device may be, for example, a ladder filter, or a filter device including a longitudinally coupled resonator acoustic wave filter. Each acoustic wave resonator of the acoustic wave device 10 may be, for example, a series-arm resonator of a ladder filter, or a parallel-arm resonator. Alternatively, each acoustic wave resonator of the acoustic wave device 10 may be an acoustic wave resonator directly or indirectly connected to a longitudinally coupled resonator acoustic wave filter.

As illustrated in FIG. 2, the first acoustic wave resonator 1A and the second acoustic wave resonator 1B share a piezoelectric substrate 11. The piezoelectric substrate 11 preferably includes a support substrate 2, an insulating layer 3 and a piezoelectric layer 4. The insulating layer 3 is provided on the support substrate 2. The piezoelectric layer 4 is provided on the insulating layer 3. The piezoelectric layer 4 includes a first main surface 4*a* and a second main surface 4*b*. The first main surface 4*a* and the second main surface 4*b* oppose each other. Of the first main surface 4*a* and the second main surface 4*b*, the first main surface 4*a* is located closer to the insulating layer 3 than the second main surface 4*b*. Of the first main surface 4*a* and the second main surface 4*b*, the second main surface 4*b* may alternatively be located closer to the insulating layer 3 than the first main surface 4*a*.

As a material of the support substrate 2, for example, a semiconductor such as silicon, a ceramic such as aluminum oxide, or the like can be used. As a material of the insulating layer 3, an appropriate dielectric such as, for example, silicon oxide or tantalum pentoxide can be used. As a material of the piezoelectric layer 4, for example, lithium niobate, lithium tantalate, zinc oxide, aluminum nitride, quartz, PZT (lead zirconate titanate), or the like can be used. As the material of the piezoelectric layer 4, for example, lithium tantalate, lithium niobate, aluminum nitride, or the like is preferably used.

The first acoustic wave resonator 1A and the second acoustic wave resonator 1B are, for example, bulk acoustic wave (BAW) elements. To be more specific, the first acoustic wave resonator 1A includes a first excitation electrode 5 and a second excitation electrode 6. The first excitation electrode 5 is provided on the first main surface 4*a* of the piezoelectric layer 4. The second excitation electrode 6 is provided on the second main surface 4*b* of the piezoelectric layer 4. The first excitation electrode 5 and the second excitation electrode 6 oppose each other with the piezoelectric layer 4 interposed therebetween. A region of the piezoelectric layer 4 interposed between the first excitation electrode 5 and the second excitation electrode 6 is a first excitation region A1. By applying an alternating electric field to a space between the first excitation electrode 5 and the second excitation electrode 6, an acoustic wave is excited in the first excitation region A1.

Similarly, the second acoustic wave resonator 1B preferably includes a third excitation electrode 7 and a fourth excitation electrode 8. The third excitation electrode 7 is provided on the first main surface 4*a* of the piezoelectric layer 4. The fourth excitation electrode 8 is provided on the second main surface 4*b* of the piezoelectric layer 4. The third excitation electrode 7 and the fourth excitation electrode 8 oppose each other with the piezoelectric layer 4 interposed therebetween. A region of the piezoelectric layer 4 interposed between the third excitation electrode 7 and the fourth excitation electrode 8 is a second excitation region A2. By applying an alternating electric field to a space between the third excitation electrode 7 and the fourth excitation electrode 8, an acoustic wave is excited in the second excitation region A2.

In the present example embodiment, the first excitation region A1 and the second excitation region A2 each have a circular or substantially circular shape in a plan view. However, the shape of each of the first excitation region A1 and the second excitation region A2 in the plan view is not limited to the above, and may be, for example, a circular shape, an elliptical shape, a semi-elliptical shape or a polygonal shape. In the present specification, "in a plan view" refers to a view from a direction corresponding to an upper side in FIG. 2. For example, in FIG. 2, of a side of the piezoelectric layer 4 and a side of the support substrate 2, the side of the piezoelectric layer 4 is the upper side.

The first excitation electrode 5 and the third excitation electrode 7 are preferably provided individually. In the present specification, an expression "two electrodes are provided individually" includes a case where the two electrodes are connected to each other by an electrode formed of a material different from those of the two electrodes. In a case where the two electrodes each include a plurality of electrode layers, the two electrodes are regarded as being provided individually even when the material of the electrode connecting the two electrodes and a material of the electrode layer connected in the two electrodes are different from each other. In the present specification, an expression "a member is made of a material" includes a case where a trace amount of impurities is contained to an extent that electrical characteristics of the acoustic wave device are not significantly deteriorated.

As illustrated in FIG. 3, the first main surface 4*a* of the piezoelectric layer 4 is provided with a wiring electrode 9. The wiring electrode 9 connects the first excitation electrode 5 and the third excitation electrode 7. A material of the wiring electrode 9 is preferably different from materials of the first excitation electrode 5 and the third excitation electrode 7. In the present specification, an expression "a main surface is provided with an electrode" includes both a case where the electrode is provided on the main surface and a case where the electrode is provided close to the main surface. In other words, the case where the main surface is provided with the electrode includes both a case where the main surface is directly provided with the electrode and a case where the main surface is indirectly provided with the electrode with another layer interposed therebetween. For example, when it is described that the first main surface 4*a* is provided with the wiring electrode 9, it means that the first main surface 4*a* may be directly provided with the wiring electrode 9, or another layer may be provided between the first main surface 4*a* and the wiring electrode 9.

In the present example embodiment, the first excitation electrode 5, the third excitation electrode 7, and the wiring electrode 9 are embedded in the insulating layer 3. When the insulating layer 3 is provided on the first main surface 4*a* of the piezoelectric layer 4, it is sufficient that the insulating layer 3 is provided to cover at least a portion of the first excitation electrode 5, the third excitation electrode 7 and the wiring electrode 9. However, as described above, the second main surface 4*b* of the piezoelectric layer 4 may be a main surface located close to the insulating layer 3. The insulating layer 3 need not necessarily be provided.

As illustrated in FIG. 2, the piezoelectric substrate 11 is provided with a first acoustic reflector and a second acoustic reflector. More specifically, in the present example embodiment, the first acoustic reflector and the second acoustic reflector are provided in the insulating layer 3. The first acoustic reflector is a first cavity portion 12A. The second acoustic reflector is a second cavity portion 12B. However, the first cavity portion 12A and the second cavity portion 12B may be provided across the insulating layer 3 and the support substrate 2, or may be provided only in the support substrate 2. The first cavity portion 12A and the second cavity portion 12B are not limited to hollow portions, and may be, for example, through-holes provided in the insulating layer 3 and the support substrate 2. Alternatively, for example, the first cavity portion 12A may be provided by a concave portion being provided in the piezoelectric layer 4. Similarly, the second cavity portion 12B may be provided by a concave portion being provided in the piezoelectric layer 4. In this case, the concave portion in the piezoelectric layer 4 is preferably sealed by the insulating layer 3 or the support substrate 2. Note that each of the first acoustic reflector and the second acoustic reflector may be an acoustic reflective film described below.

The first cavity portion 12A overlaps the first excitation region A1 in a plan view. The second cavity portion 12B overlaps the second excitation region A2 in the plan view. Thus, energy of an acoustic wave can be preferably confined to the side of the piezoelectric layer 4.

The first acoustic reflector may extend to a portion that does not overlap the second excitation electrode 6 in a plan view. The second acoustic reflector may extend to a portion that does not overlap the fourth excitation electrode 8 in the plan view.

It is sufficient that the piezoelectric substrate 11 is provided with at least one acoustic reflector. For example, the first excitation region A1 and the second excitation region A2 illustrated in FIG. 2 may overlap the same acoustic reflector.

The present example embodiment is preferably characterized in that each of the first excitation electrode 5 and the third excitation electrode 7 is provided individually, and the wiring electrode 9 connects the first excitation electrode 5 and the third excitation electrode 7. This can reduce or prevent an unnecessary wave, and can reduce or prevent a thermal stress. This will be described below.

For example, when the first excitation electrode 5 and the third excitation electrode 7 are integrally provided, an electrode is to be provided as well between the first excitation region A1 and second excitation region A2 illustrated in FIG. 2. In this case, an area of the electrode provided on the first main surface 4*a* of the piezoelectric layer 4 is increased. Thus, a thermal stress applied from the electrode to the piezoelectric layer 4 is increased. On the other hand, in the present example embodiment, the first excitation electrode 5 and the third excitation electrode 7 are provided individually. Thus, areas of the electrodes provided on the first main surface 4*a* can be decreased, and a thermal stress applied from the electrode to the piezoelectric layer 4 can be reduced or prevented. Thus, the piezoelectric layer 4 is less likely to be damaged.

In addition, the material of the wiring electrode 9 is different from the material of the first excitation electrode 5. Thus, an unnecessary wave generated in the first acoustic wave resonator 1A is less likely to propagate from the first excitation electrode 5 to the wiring electrode 9. Similarly, the material of the wiring electrode 9 is different from the material of the third excitation electrode 7. Thus, an unnecessary wave generated in the second acoustic wave resonator 1B is less likely to propagate from the third excitation electrode 7 to the wiring electrode 9. Thus, coupling of unnecessary waves generated in the first acoustic wave resonator 1A and the second acoustic wave resonator 1B can be reduced or prevented. Thus, an unnecessary wave can be reduced or prevented. Furthermore, it is also possible to prevent unnecessary waves generated in the first acoustic wave resonator 1A and the second acoustic wave resonator 1B from affecting each other.

In the present example embodiment, the first excitation electrode 5 and the third excitation electrode 7 are each preferably formed of a laminated metal film. The first excitation electrode 5 includes a first layer 5*a* and a second layer 5*b* as a plurality of electrode layers. The first layer 5*a* and the second layer 5*b* are laminated in this order from the side of the piezoelectric layer 4. Similarly, the third excitation electrode 7 includes a first layer 7*a* and a second layer 7*b* as a plurality of electrode layers. The first layer 7*a* and the second layer 7*b* are laminated in this order from the side of the piezoelectric layer 4. Further, the second excitation electrode 6 also includes a first layer 6*a* and a second layer 6*b* as a plurality of electrode layers. The fourth excitation electrode 8 also includes a first layer 8*a* and a second layer 8*b* as a plurality of electrode layers. As a material of each electrode layer, for example, metal or an alloy including at least one of Al, Au, Cu, Cr, Ru, W, Mo and Pt can be used.

The number of layers of each of the first excitation electrode 5, the second excitation electrode 6, the third excitation electrode 7 and the fourth excitation electrode 8 is not limited to two, and may be three or more, for example. Alternatively, the first excitation electrode 5, the second excitation electrode 6, the third excitation electrode 7 and the fourth excitation electrode 8 may each be formed of a single-layer metal film.

The wiring electrode 9 is made of a single-layer metal film. As the material of the wiring electrode 9, for example, metal or an alloy including at least one of Al, Au, Cu, Cr, Ru, W, Mo and Pt can be used. It is sufficient that the material of the wiring electrode 9 and the materials of the electrode layers connected by the wiring electrode 9 in the first excitation electrode 5 and the third excitation electrode 7 are different from each other. The wiring electrode 9 may be formed of a laminated metal film. In this case, it is preferable that materials of all layers of the wiring electrode 9 and the materials of all the electrode layers of the first excitation electrode 5 and the third excitation electrode 7 be different from each other.

In the present example embodiment, a thickness of the wiring electrode 9 is larger than a thickness of the first excitation electrode 5, and larger than a thickness of the third excitation electrode 7. The wiring electrode 9 connects all the electrode layers of the first excitation electrode 5 and all the electrode layers of the third excitation electrode 7. Then, the wiring electrode 9 extends to a surface of the first excitation electrode 5 close to the first cavity portion 12A, and a surface of the third excitation electrode 7 close to the second cavity portion 12B. This makes it possible to effectively reduce wiring resistance in the acoustic wave device 10.

However, the thickness of the wiring electrode 9 may be equal to or less than the thickness of the first excitation electrode 5, and may be equal to or less than the thickness of the third excitation electrode 7. Even in this case, the wiring electrode 9 may connect all the electrode layers of the first excitation electrode 5 and all the electrode layers of the third excitation electrode 7. Note that it is sufficient that the wiring electrode 9 connects at least one electrode layer of the first excitation electrode 5 and at least one electrode layer of the third excitation electrode 7.

The first excitation electrode 5 and the third excitation electrode 7 have the same or substantially the same thickness. The thickness of the first excitation electrode 5 and the thickness of the third excitation electrode 7 may be different from each other.

In the acoustic wave device 10, when an acoustic wave is excited, heat is generated in the first excitation region A1 and the second excitation region A2. In the present example embodiment, as described above, the wiring electrode 9 extends to the surface of the first excitation electrode 5 close to the first cavity portion 12A, and the surface of the third excitation electrode 7 close to the second cavity portion 12B. This can increase an area of a portion of the wiring electrode 9 in contact with the insulating layer 3. Thus, heat transferred from the first excitation electrode 5 and the third excitation electrode 7 to the wiring electrode 9 can be efficiently transferred to the insulating layer 3. Thus, heat dissipation performance can be improved.

In addition, in the present example embodiment, the support substrate 2 is laminated on the insulating layer 3. Thus, heat can be transferred from the insulating layer 3 to the support substrate 2. Thus, heat can be easily dissipated outside. Thus, the heat dissipation performance can be effectively improved. The piezoelectric substrate 11 need not necessarily include the support substrate 2, or need not necessarily include the insulating layer 3. It is sufficient that the piezoelectric substrate 11 has the piezoelectric layer 4.

As the material of the piezoelectric layer 4, for example, any of lithium tantalate, lithium niobate and aluminum nitride is preferably used. Lithium tantalate and lithium niobate are each a piezoelectric material having a high dielectric constant. Thus, when the acoustic wave device 10 is used for a broadband filter, lithium tantalate or lithium niobate can be preferably used for the piezoelectric layer 4. Then, the acoustic wave device 10 has the above-described configuration, thus the heat dissipation performance is high. On the other hand, for example, aluminum nitride is excellent in thermal conductivity. Thus, when aluminum nitride is used for the piezoelectric layer 4, the heat dissipation performance can be further improved.

Thermal conductivity of the support substrate 2 is preferably higher than thermal conductivity of each of the piezoelectric layer 4 and the insulating layer 3. This makes it possible to more reliably and effectively improve the heat dissipation performance. The support substrate 2 need not necessarily be provided.

Figure 4:
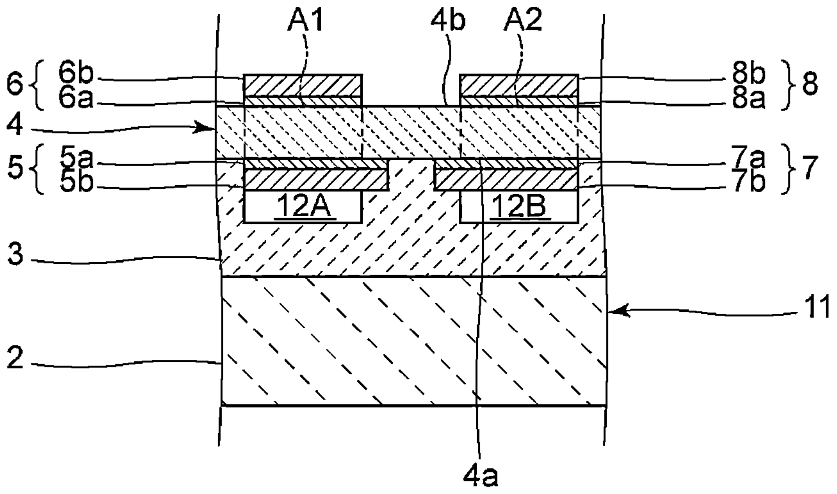
FIG. 4 is a schematic elevational cross-sectional view of an acoustic wave device according to a first modification of the first example embodiment of the present invention.

The insulating layer 3 covers the first excitation electrode 5, the third excitation electrode 7, and the wiring electrode 9. Thus, a portion of the insulating layer 3 is provided between the first cavity portion 12A as the first acoustic reflector and the first excitation electrode 5. Similarly, a portion of the insulating layer 3 is provided between the second cavity portion 12B as the second acoustic reflector and the third excitation electrode 7. However, the present invention is not limited to this. For example, in a first modification of the first example embodiment illustrated in FIG. 4, the first cavity portion 12A as the first acoustic reflector is in contact with the first excitation electrode 5. That is, the insulating layer 3 is not provided between the first acoustic reflector and the first excitation electrode 5. The second cavity portion 12B as the second acoustic reflector is in contact with the third excitation electrode 7. That is, the insulating layer 3 is not provided between the second acoustic reflector and the third excitation electrode 7. Also in the present modification, as in the first example embodiment, it is possible to reduce or prevent an unnecessary wave and to reduce or prevent a thermal stress.

As illustrated in FIG. 3, in the present example embodiment, the wiring electrode 9 is provided so as not to overlap the first cavity portion 12A and the second cavity portion 12B in a plan view. To be specific, each of the first cavity portion 12A and the second cavity portion 12B is provided individually. To be more specific, the first cavity portion 12A and the second cavity portion 12B are separated by the insulating layer 3. The wiring electrode 9 is located between the first cavity portion 12A and the second cavity portion 12B in the plan view. Thus, in the acoustic wave device 10, it is possible to reduce a difference in stress between a portion of overlapping the first cavity portion 12A and the second cavity portion 12B and a portion not overlapping the first cavity portion 12A and the second cavity portion 12B in the plan view.

Furthermore, in the present example embodiment, the first cavity portion 12A and the second cavity portion 12B each oppose the wiring electrode 9 with a gap G therebetween in a plan view. Thus, even when the first cavity portion 12A, the second cavity portion 12B and the wiring electrode 9 are misaligned in manufacturing of the acoustic wave device 10, it is possible to more reliably prevent the first cavity portion 12A and the second cavity portion 12B from overlapping the wiring electrode 9 in the plan view. Thus, it is possible to more reliably reduce or prevent a variation in stress at each position in the acoustic wave device 10.

Incidentally, in the present example embodiment, the second excitation electrode 6 and the fourth excitation electrode 8 are also provided individually, as with the first excitation electrode 5 and the third excitation electrode 7. Then, as illustrated in FIG. 1, the second main surface 4*b* of the piezoelectric layer 4 is provided with a wiring electrode 19. The wiring electrode 19 connects the second excitation electrode 6 and the fourth excitation electrode 8. A material of the wiring electrode 19 is different from materials of the second excitation electrode 6 and the fourth excitation electrode 8. With this, a similar effect to the effect obtained by the configuration in which the first excitation electrode 5 and the third excitation electrode 7 are connected to each other by the wiring electrode 9 can be obtained.

To be more specific, an unnecessary wave generated in the first acoustic wave resonator 1A is less likely to propagate from the second excitation electrode 6 to the wiring electrode 19. Thus, an unnecessary wave generated in the second acoustic wave resonator 1B is less likely to propagate from the fourth excitation electrode 8 to the wiring electrode 19. Thus, coupling of unnecessary waves generated in the first acoustic wave resonator 1A and the second acoustic wave resonator 1B can be effectively reduced or prevented. Thus, an unnecessary wave can be effectively reduced or prevented. Furthermore, it is also possible to effectively reduce or prevent unnecessary waves generated in the first acoustic wave resonator 1A and the second acoustic wave resonator 1B from affecting each other.

In addition, since the second excitation electrode 6 and the fourth excitation electrode 8 are provided individually, an area of the electrode provided on the second main surface 4*b* of the piezoelectric layer 4 can be decreased. This can reduce or prevent a thermal stress applied from the electrode to the piezoelectric layer 4. Thus, the piezoelectric layer 4 can be more reliably made less likely to be damaged.

The second excitation electrode 6 and the fourth excitation electrode 8 need not necessarily be provided individually. The second excitation electrode 6 and the fourth excitation electrode 8 may be integrally provided.

Figure 5:
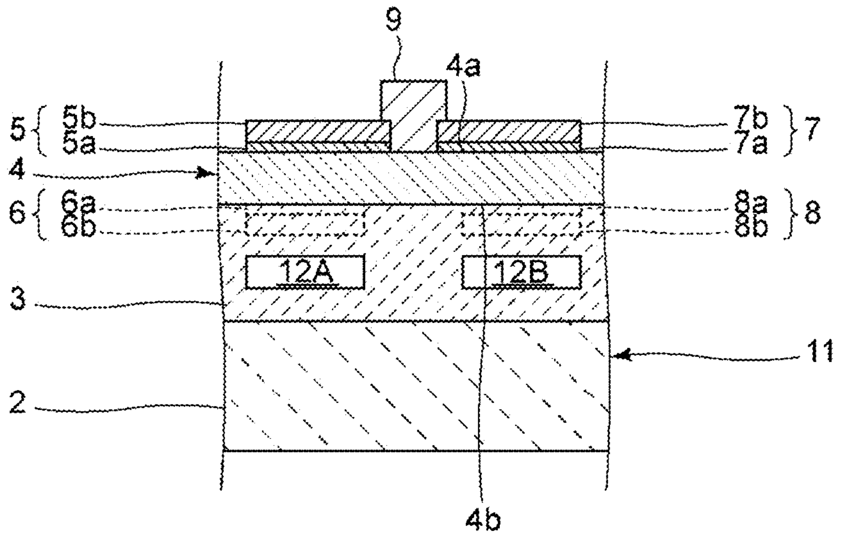
FIG. 5 is a schematic elevational cross-sectional view of an acoustic wave device according to a second modification of the first example embodiment of the present invention.

As described above, the first main surface 4*a* of the piezoelectric layer 4 need not be located close to the insulating layer 3. In a second modification of the first example embodiment illustrated in FIG. 5, the second main surface 4*b* of the first main surface 4*a* and the second main surface 4*b* of the piezoelectric layer 4 is located close to the insulating layer 3. Also in the present modification, each of the first excitation electrode 5 and the third excitation electrode 7 is provided individually on the first main surface 4*a*, and the wiring electrode 9 connects the first excitation electrode 5 and the third excitation electrode 7. Accordingly, as in the first example embodiment, it is possible to reduce or prevent an unnecessary wave and to reduce or prevent a thermal stress.

As described above, in the first example embodiment, each of the first excitation electrode 5 and the third excitation electrode 7 is provided individually on the first main surface 4*a* of the piezoelectric layer 4, and the wiring electrode 9 connects the first excitation electrode 5 and the third excitation electrode 7. In this case, each of the second excitation electrode 6 and the fourth excitation electrode 8 need not necessarily be provided individually on the second main surface 4*b*. On the other hand, as in the second modification of the first example embodiment, the second main surface 4*b* may be located close to the insulating layer 3. In this case, each of the first excitation electrodes 5 and the third excitation electrodes 7 may be provided individually on the first main surface 4*a*, and the wiring electrode 9 may connect the first excitation electrode 5 and the third excitation electrode 7. Then, also in this case, each of the second excitation electrode 6 and the fourth excitation electrode 8 need not necessarily be provided individually on the first main surface 4*a*.

However, as in the first example embodiment, it is preferable that each excitation electrode is provided individually on both the first main surface 4*a* and the second main surface 4*b*, and the excitation electrodes be connected to each other by the wiring electrode. This can further reduce or prevent an unnecessary wave, and can further reduce or prevent a thermal stress.

When the acoustic wave device 10 is used for a filter device, the first acoustic wave resonator 1A and the second acoustic wave resonator 1B are connected in parallel to each other. However, the first acoustic wave resonator 1A and the second acoustic wave resonator 1B may be connected in series to each other.

Figure 6:
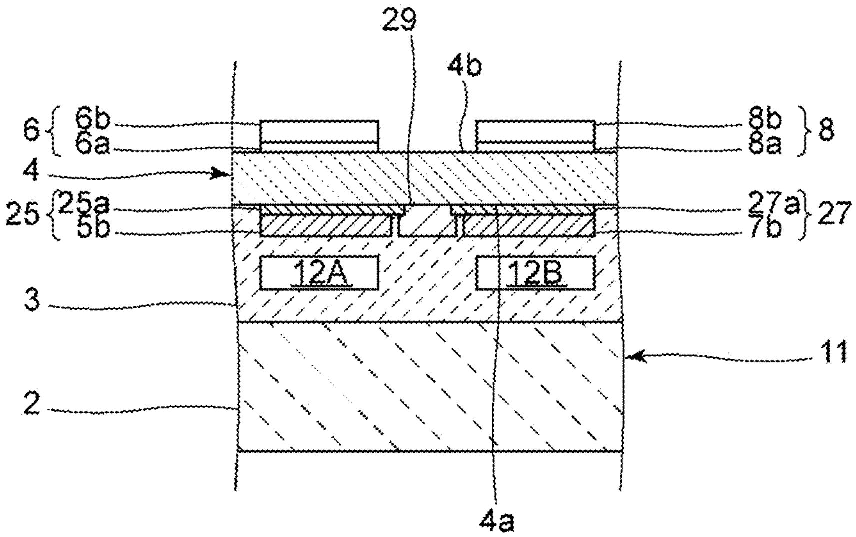
FIG. 6 is a schematic elevational cross-sectional view of an acoustic wave device according to a second example embodiment of the present invention.

FIG. 6 is a schematic elevational cross-sectional view of an acoustic wave device according to a second example embodiment of the present invention.

The present example embodiment is different from the first example embodiment in a configuration of a first layer 25*a* of a first excitation electrode 25 and a configuration of a first layer 27*a* of a third excitation electrode 27. The present example embodiment is also different from the first example embodiment in that a wiring electrode 29 connects only some of electrode layers of the first excitation electrode 25 and the third excitation electrode 27 to each other and a thickness of the wiring electrode 29 is different from that of the first example embodiment. Except for the above point, the acoustic wave device of the present example embodiment has the same or similar configuration to that of the acoustic wave device 10 of the first example embodiment.

The thickness of the wiring electrode 29 is the same or substantially the same as a thickness of the first excitation electrode 25 and a thickness of the third excitation electrode 27. The wiring electrode 29 connects an electrode layer of the first excitation electrode 25 closest to the piezoelectric layer 4 and an electrode layer of the third excitation electrode 27 closest to the piezoelectric layer 4. To be more specific, the wiring electrode 29 connects the first layer 25*a* of the first excitation electrode 25 and the first layer 27*a* of the third excitation electrode 27. On the other hand, the wiring electrode 29 is not in contact with an electrode layer other than the first layer 25*a* in the first excitation electrode 25 and with an electrode layer other than the first layer 27*a* in the third excitation electrode 27.

More specifically, in the first excitation electrode 25, the first layer 25*a* is extended toward the third excitation electrodes 27. In particular, in the first excitation electrode 25, an end edge portion of the first layer 25*a* close to the third excitation electrode 27 is located closer to the third excitation electrode 27 than an end edge portion of the other electrode layer close to the third excitation electrode 27. Similarly, in the third excitation electrode 27, the first layer 27*a* are extended toward the first excitation electrode 25. In particular, in the third excitation electrode 27, an end edge portion of the first layer 27*a* close to the first excitation electrode 25 is located closer to the first excitation electrode 25 than an end edge portion of the other electrode layer close to the first excitation electrode 25. A portion of the first excitation electrode 25 from which the first layer 25*a* is extended and a portion of the third excitation electrode 27 from which the first layer 27*a* is extended are connected to each other by the wiring electrode 29.

Also in the present example embodiment, as in the first example embodiment, each of the first excitation electrode 25 and the third excitation electrode 27 is provided individually, and the wiring electrode 29 connects the first excitation electrode 25 and the third excitation electrode 27. This can reduce or prevent an unnecessary wave, and can reduce or prevent a thermal stress.

The thickness of the wiring electrode 29 may be smaller or larger than the thickness of the first excitation electrode 25 and the thickness of the third excitation electrode 27.

It is preferable that a material of the wiring electrode 29 and materials of all the electrode layers of the first excitation electrode 25 and all the electrode layers of the third excitation electrode 27 are different from each other. For example, when the acoustic wave device is manufactured, the first excitation electrode 25, the third excitation electrode 27 and the wiring electrode 29 may be misaligned, and unintended electrode layers may be connected to each other by the wiring electrode 29. Even in such a case, the materials of the electrode layers connected by the wiring electrode 29 can be made different from the material of the wiring electrode 29.

Figure 7:
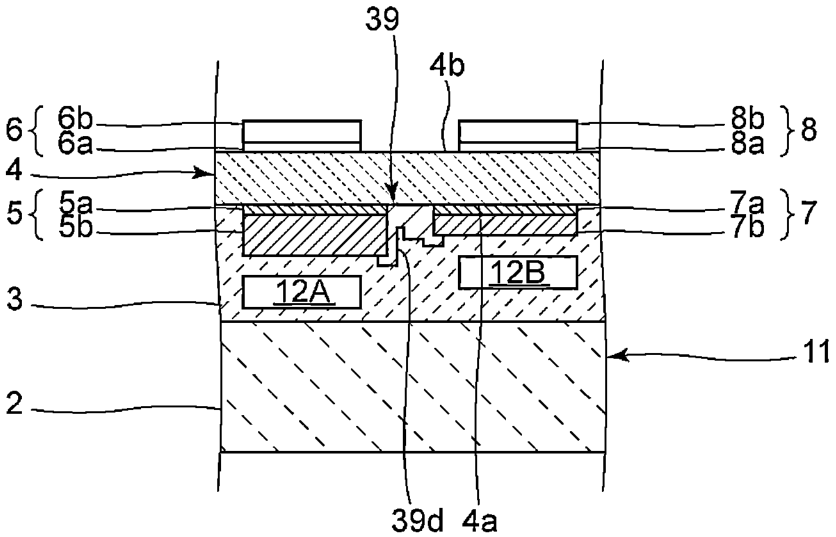
FIG. 7 is a schematic elevational cross-sectional view of an acoustic wave device according to a third example embodiment of the present invention.

FIG. 7 is a schematic elevational cross-sectional view of an acoustic wave device according to a third example embodiment of the present invention.

The present example embodiment is different from the first example embodiment in that the thickness of the first excitation electrode 5 and the thickness of the third excitation electrode 7 are different from each other, and that a wiring electrode 39 includes a step portion 39*d*. A distance between the first excitation electrode 5 and the first cavity portion 12A and a distance between the third excitation electrode 7 and the second cavity portion 12B are the same or substantially the same. Thus, the present example embodiment is different from the first example embodiment also in that respective positions of the first cavity portion 12A and the second cavity portion 12B in a thickness direction of the insulating layer 3 are different from each other. Except for the above point, the acoustic wave device of the present example embodiment has the same or similar configuration to that of the acoustic wave device 10 of the first example embodiment.

The thickness of the first excitation electrode 5 is larger than the thickness of the third excitation electrode 7. However, the thickness of the first excitation electrode 5 may be equal to or less than the thickness of the third excitation electrode 7.

Also in the present example embodiment, as in the first example embodiment, each of the first excitation electrode 5 and the third excitation electrode 7 is provided individually, and the wiring electrode 39 connects the first excitation electrode 5 and the third excitation electrode 7. This can reduce or prevent an unnecessary wave, and can reduce or prevent a thermal stress.

In addition, the wiring electrode 39 includes a plurality of the step portions 39*d*. To be more specific, a portion of the wiring electrode 39 overlapping a portion between the first excitation electrode 5 and the third excitation electrode 7 in a plan view is provided with each step portion 39*d*. Thicknesses of portions of the wiring electrode 39 connected by the step portion 39*d* are different from each other. Thus, a propagation pattern of an unnecessary wave is not uniform in the wiring electrode 39. Thus, it is possible to reduce or prevent an increase in intensity of the unnecessary wave. Further, the step portion 39*d* is provided, and thus it is possible to increase an area of a portion of the wiring electrode 39 in contact with the insulating layer 3. Thus, heat transferred from the first excitation electrode 5 and the third excitation electrode 7 to the wiring electrode 39 can be efficiently transferred to the insulating layer 3. Thus, the heat dissipation performance can be improved.

Figure 8:
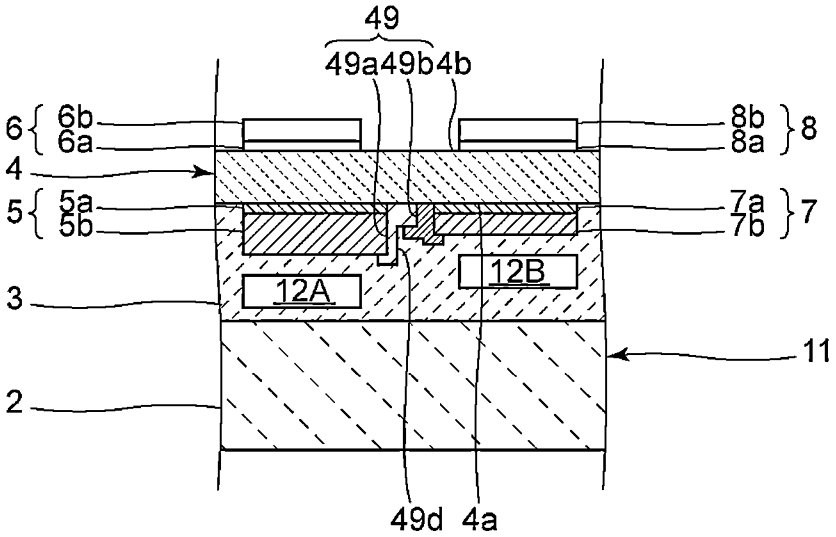
FIG. 8 is a schematic elevational cross-sectional view of an acoustic wave device according to a fourth example embodiment of the present invention.

FIG. 8 is a schematic elevational cross-sectional view of an acoustic wave device according to a fourth example embodiment of the present invention.

The present example embodiment is different from the third example embodiment in that a wiring electrode 49 includes a plurality of wiring electrode portions. The plurality of wiring electrode portions are made of materials different from each other. Except for the above point, the acoustic wave device of the present example embodiment has the same or similar configuration to that of the acoustic wave device of the third example embodiment.

The plurality of wiring electrode portions of the wiring electrode 49 includes, specifically, a first wiring electrode portion 49*a* and a second wiring electrode portion 49*b*. The first wiring electrode portion 49*a* is connected to the first excitation electrode 5. The first wiring electrode portion 49*a* is provided on the first main surface 4*a* of the piezoelectric layer 4 and on the surface of the first excitation electrode 5 close to the first cavity portion 12A. The first wiring electrode portion 49*a* is not connected to the third excitation electrode 7.

The second wiring electrode portion 49*b* is connected to the third excitation electrode 7. The second wiring electrode portion 49*b* is provided on the first main surface 4*a* of the piezoelectric layer 4, on the surface of the third excitation electrode 7 adjacent to the second cavity portion 12B and on the first wiring electrode portion 49*a*. The second wiring electrode portion 49*b* is not connected to the first excitation electrode 5.

Also in the present example embodiment, as in the third example embodiment, each of the first excitation electrode 5 and the third excitation electrode 7 is provided individually, and the wiring electrode 49 connects the first excitation electrode 5 and the third excitation electrode 7. This can reduce or prevent an unnecessary wave, and can reduce or prevent a thermal stress.

In addition, the first wiring electrode portion 49*a* and the second wiring electrode portion 49*b* are made of materials different from each other, and materials of the first wiring electrode portion 49*a* and the second wiring electrode portion 49*b* are different from the materials of the first excitation electrode 5 and the third excitation electrode 7. Thus, an unnecessary wave is less likely to propagate from the first excitation electrode 5 to the first wiring electrode portion 49*a*, and an unnecessary wave is less likely to propagate from the first wiring electrode portion 49*a* to the second wiring electrode portion 49*b*. Similarly, an unnecessary wave is less likely to propagate from the third excitation electrode 7 to the second wiring electrode portion 49*b*, and an unnecessary wave is less likely to propagate from the second wiring electrode portion 49*b* to the first wiring electrode portion 49*a*. Thus, coupling of unnecessary waves generated in the first acoustic wave resonator 1A and the second acoustic wave resonator 1B can be reduced or prevented.

Further, as in the third example embodiment, the wiring electrode 49 includes a plurality of step portions 49*d*. To be more specific, in the present example embodiment, each of the first wiring electrode portion 49*a* and the second wiring electrode portion 49*b* is provided with the step portion 49*d*. The step portion 49*d* is also provided between an upside of the first wiring electrode portion 49*a* and an upside of the second wiring electrode portion 49*b*. Thicknesses of portions in the wiring electrode 49 connected by the step portion 49*d* are different from each other. Thus, propagation pattern of an unnecessary wave is not uniform in the wiring electrode 49. Thus, an unnecessary wave can be effectively reduced or prevented. It is possible to increase an area of a portion of the wiring electrode 49 in contact with the insulating layer 3, and the heat dissipation performance can be enhanced.

Figure 9:
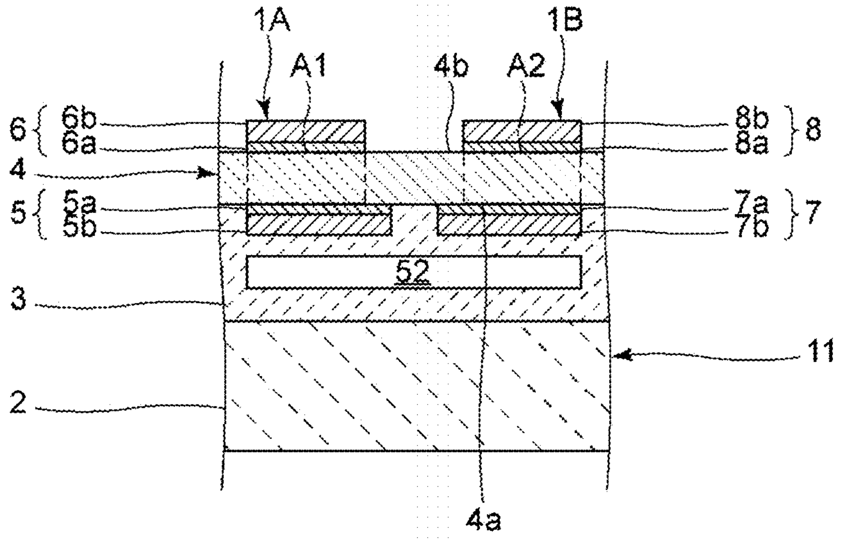
FIG. 9 is a schematic elevational cross-sectional view illustrating a cross section passing through each excitation electrode of an acoustic wave device according to a fifth example embodiment of the present invention.
Figure 10:
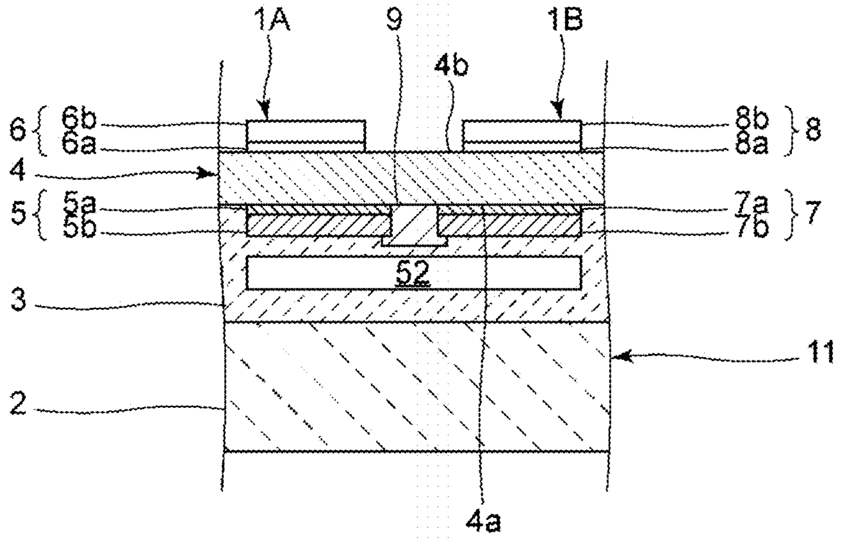
FIG. 10 is a schematic elevational cross-sectional view illustrating a cross section passing through a wiring electrode of the acoustic wave device according to the fifth example embodiment of the present invention.

FIG. 9 is a schematic elevational cross-sectional view illustrating a cross section passing through each excitation electrode of an acoustic wave device according to a fifth example embodiment of the present invention. FIG. 10 is a schematic elevational cross-sectional view illustrating a cross section passing through a wiring electrode of the acoustic wave device according to the fifth example embodiment.

As illustrated in FIG. 9, the present example embodiment is different from the first example embodiment in a configuration of a cavity portion 52 as an acoustic reflector. To be more specific, both the first excitation region A1 and the second excitation region A2 overlap the same one cavity portion 52 in a plan view. Except for the above point, the acoustic wave device of the present example embodiment has the same or similar configuration to that of the acoustic wave device 10 of the first example embodiment.

As illustrated in FIG. 10, also in the present example embodiment, as in the first example embodiment, each of the first excitation electrode 5 and the third excitation electrode 7 is provided individually, and the wiring electrode 9 connects the first excitation electrode 5 and the third excitation electrode 7. This can reduce or prevent an unnecessary wave, and can reduce or prevent a thermal stress.

In addition, since one cavity portions 52 is provided, it is not necessary to provide a plurality of inter-cavity portions. Thus, a distance between the first acoustic wave resonator 1A and the second acoustic wave resonator 1B can be shortened. Further, the first excitation electrode 5 and the third excitation electrode 7 are connected to each other by the wiring electrode 9. Thus, even when the distance between the first acoustic wave resonator 1A and the second acoustic wave resonator 1B is shortened, unnecessary waves generated in the first acoustic wave resonator 1A and the second acoustic wave resonator 1B are prevented from affecting each other. Thus, miniaturization of the acoustic wave device can be promoted without causing deterioration in electrical characteristics.

Figure 11:
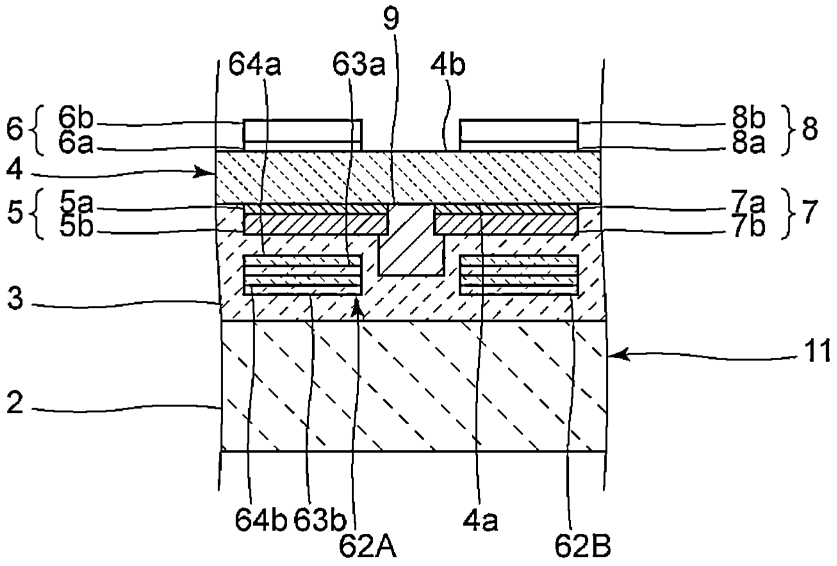
FIG. 11 is a schematic elevational cross-sectional view of an acoustic wave device according to a sixth example embodiment of the present invention.

FIG. 11 is a schematic elevational cross-sectional view of an acoustic wave device according to a sixth example embodiment of the present invention.

The present example embodiment is different from the first example embodiment in that an acoustic reflector is an acoustic reflective film provided on the piezoelectric substrate 11. To be more specific, in the present example embodiment, the first acoustic reflector is a first acoustic reflective film 62A. A second acoustic reflector is a second acoustic reflective film 62B. The first acoustic reflective film 62A and the second acoustic reflective film 62B are provided in the insulating layer 3. Except for the above point, the acoustic wave device of the present example embodiment has the same or similar configuration to that of the acoustic wave device 10 of the first example embodiment.

The first acoustic reflective film 62A and the second acoustic reflective film 62B are each a laminate of a plurality of acoustic impedance layers. To be more specific, the first acoustic reflective film 62A includes a plurality of low-acoustic-impedance layers and a plurality of high-acoustic-impedance layers. The low-acoustic-impedance layer is a layer having a relatively low acoustic impedance. The plurality of low-acoustic-impedance layers of the first acoustic reflective film 62A includes a low-acoustic-impedance layer 63*a* and a low-acoustic-impedance layer 63*b*. On the other hand, the high-acoustic-impedance layer is a layer having a relatively high acoustic impedance. The plurality of high-acoustic-impedance layers of the first acoustic reflective film 62A includes a high-acoustic-impedance layer 64*a* and a high-acoustic-impedance layer 64*b*. The low-acoustic-impedance layers and the high-acoustic-impedance layers are alternately laminated.

In the present example embodiment, the high-acoustic-impedance layer 64*a* is a layer of the first acoustic reflective film 62A located closest to the piezoelectric layer 4. A portion of the insulating layer 3 is located between the high-acoustic-impedance layer 64*a* and the piezoelectric layer 4. The second acoustic reflective film 62B is configured similarly to the first acoustic reflective film 62A.

In the present example embodiment, an acoustic impedance of the insulating layer 3 is lower than an acoustic impedance of each high-acoustic-impedance layer. Thus, a portion of the insulating layer 3 laminated on the high-acoustic-impedance layer 64*a* of the first acoustic reflective film 62A functions as a low-acoustic-impedance layer. Thus, the first excitation electrode 5 is substantially in contact with an acoustic reflective film. Similarly, the third excitation electrode 7 is substantially in contact with an acoustic reflective film.

For example, in the first acoustic reflective film 62A, the low-acoustic-impedance layer 63*a* may be a layer located closest to the piezoelectric layer 4. In this case, it is preferable that the insulating layer 3 be not provided between the first acoustic reflective film 62A and the first excitation electrode 5. The same applies to the second acoustic reflective film 62B.

The first acoustic reflective film 62A and the second acoustic reflective film 62B each have include two low-acoustic-impedance layers and the two high-acoustic-impedance layers. It is sufficient that the first acoustic reflective film 62A and the second acoustic reflective film 62B each include at least one low-acoustic-impedance layer and at least one high-acoustic-impedance layer. Each of the number of the acoustic impedance layers in the first acoustic reflective film 62A and the number of the acoustic impedance layers in the second acoustic reflective film 62B may be odd number. For example, in the first acoustic reflective film 62A, each of two high-acoustic-impedance layers may be an outermost layer, and the outermost high-acoustic-impedance layers and an insulating layer functioning as a low-acoustic-impedance layer may be laminated. The same applies to the second acoustic reflective film 62B.

As a material of the low-acoustic-impedance layer, for example, silicon oxide, aluminum, or the like can be used. When the insulating layer 3 functions as the low-acoustic-impedance layer, the insulating layer 3 is made of, for example, silicon oxide. As a material of the high-acoustic-impedance layer, for example, metal such as platinum or tungsten, or a dielectric such as aluminum nitride or silicon nitride can be used.

The first acoustic reflective film 62A and the second acoustic reflective film 62B are provided, and thus it is possible to effectively confine energy of an acoustic wave to the side of the piezoelectric layer 4. Additionally, also in the present example embodiment, as in the first example embodiment, each of the first excitation electrode 5 and the third excitation electrode 7 is provided individually, and the wiring electrode 9 connects the first excitation electrode 5 and the third excitation electrode 7. This can reduce or prevent an unnecessary wave, and can reduce or prevent a thermal stress. Note that both the first excitation region A1 and the second excitation region A2 may overlap the same one acoustic reflective film in a plan view.

Acoustic wave devices according to example embodiments of the present invention may be, for example, a filter device. An example of this will be illustrated below.

Figure 12:
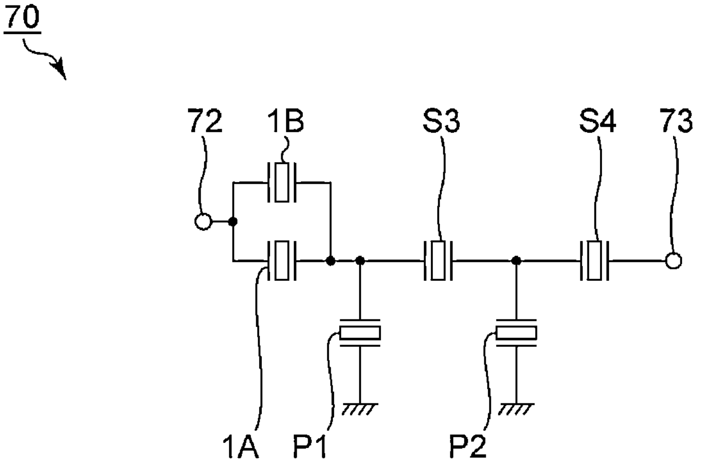
FIG. 12 is a circuit diagram of an acoustic wave device according to a seventh example embodiment of the present invention.

FIG. 12 is a circuit diagram of an acoustic wave device according to a seventh example embodiment of the present invention.

An acoustic wave device 70 is, for example, a ladder filter. The acoustic wave device 70 includes a first signal terminal 72, a second signal terminal 73, and a plurality of series-arm resonators and a plurality of parallel-arm resonators as a plurality of resonators. The plurality of resonators includes the first acoustic wave resonator 1A, the second acoustic wave resonator 1B and a plurality of resonators other than the first acoustic wave resonator 1A and the second acoustic wave resonator 1B. In the present example embodiment, the first acoustic wave resonator 1A and the second acoustic wave resonator 1B have similar configurations as those in the first example embodiment. However, the configurations of the first acoustic wave resonator 1A and the second acoustic wave resonator 1B are not limited to the above, and may have the configurations of the present invention, such as the configurations of the example embodiments other than the first example embodiment.

The acoustic wave device 70 is, for example, a transmission filter. A signal is inputted from the first signal terminal 72. A signal is outputted from the second signal terminal 73. The second signal terminal 73 is an antenna terminal in the present example embodiment. The antenna terminal is connected to an antenna. The first signal terminal 72 and the second signal terminal 73 may be configured as, for example, electrode lands or may be configured as wiring lines. The acoustic wave device 70 may be, for example, a reception filter. In this case, the first signal terminal 72 may be an antenna terminal or the like.

The plurality of series-arm resonators of the present example embodiment include, for example, the first acoustic wave resonator 1A, the second acoustic wave resonator 1B, a series-arm resonator S3 and a series-arm resonator S4. The series-arm resonator S3 and the series-arm resonator S4 are connected in series to each other between the first signal terminal 72 and the second signal terminal 73. The first acoustic wave resonator 1A and the second acoustic wave resonator 1B are connected in parallel to each other between the first signal terminal 72 and the series-arm resonator S3.

On the other hand, the plurality of parallel-arm resonators of the present example embodiment include, for example, a parallel-arm resonator P1 and a parallel-arm resonator P2. The parallel-arm resonator P1 is connected to a path between a ground potential and a connection point between the first and second acoustic wave resonators 1A and 1B and the series-arm resonators S3. The parallel-arm resonator P2 is connected to a path between the ground potential and a connection point between the series-arm resonators S3 and the series-arm resonator S4. Note that each parallel-arm resonator is connected to a ground terminal. The ground terminal is connected to the ground potential.

As illustrated with reference to FIG. 3, as in the first example embodiment, each of the first excitation electrode 5 of the first acoustic wave resonator 1A and the third excitation electrode 7 of the second acoustic wave resonator 1B is provided individually, and the wiring electrode 9 connects the first excitation electrode 5 and the third excitation electrode 7. This can reduce or prevent a thermal stress. In addition, coupling of unnecessary waves generated in the first acoustic wave resonator 1A and the second acoustic wave resonator 1B connected in parallel can be reduced or prevented. Note that in the present example embodiment, the wiring electrode 9 is connected to output sides of the first acoustic wave resonator 1A and the second acoustic wave resonator 1B. In this case, it is also possible to prevent unnecessary waves in signals inputted to the first acoustic wave resonator 1A and the second acoustic wave resonator 1B from passing through the first acoustic wave resonator 1A and the second acoustic wave resonator 1B and being coupled.

The wiring electrode 9 is connected to a resonator other than the first acoustic wave resonator 1A and the second acoustic wave resonator 1B. In particular, the wiring electrode 9 is connected to the series-arm resonator S3 and the parallel-arm resonator P1 illustrated in FIG. 12. As described above, coupling of unnecessary waves in the first acoustic wave resonator 1A and the second acoustic wave resonator 1B can be reduced or prevented, and thus unnecessary waves can be prevented from being propagated to the series-arm resonator S3 and the parallel-arm resonator P1. Thus, filter characteristics of the acoustic wave device 70 are prevented from deteriorating.

The circuit configuration in the case where the acoustic wave device 70 is a filter device is not limited to the above. It is sufficient that the acoustic wave device 70 includes the first acoustic wave resonator 1A, the second acoustic wave resonator 1B and at least one resonator other than the first acoustic wave resonator 1A and the second acoustic wave resonator 1B. For example, the first acoustic wave resonator 1A and the second acoustic wave resonator 1B may be parallel-arm resonators. However, it is preferable that the first acoustic wave resonator 1A and the second acoustic wave resonator 1B be connected in parallel to each other. In this case, coupling of unnecessary waves can be preferably reduced or prevented.

End portions on the output sides of the first acoustic wave resonator 1A and the second wave resonator 1B need not necessarily be connected to other resonators. For example, the end portions on the output sides of the first acoustic wave resonator 1A and the second wave resonator 1B may be connected to the first signal terminal 72 or the second signal terminal 73, as a signal terminal, by the wiring electrode 9. Alternatively, the end portion may be connected to the ground terminal by the wiring electrode 9. However, as in the present example embodiment, the end portions on the output sides of the first acoustic wave resonator 1A and the second acoustic wave resonator 1B are preferably connected to other resonators by the wiring electrode 9. In this case, as described above, propagation of unnecessary waves to the other resonators can be reduced or prevented. Thus, the configuration in which the first excitation electrode 5 and the third excitation electrode 7 are connected to the wiring electrode 9 is particularly preferable.

The acoustic wave device 70 may include a longitudinally coupled resonator acoustic wave filter as a resonator. In this case, it is sufficient that the first acoustic wave resonator 1A and the second acoustic wave resonator 1B are series-arm resonators or parallel-arm resonators directly or indirectly connected to the longitudinally coupled resonator acoustic wave filter.

Figure 13:
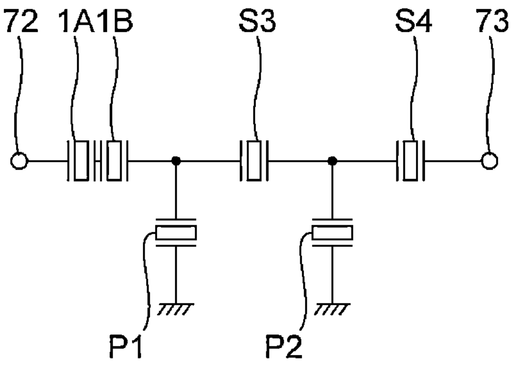
FIG. 13 is a circuit diagram of an acoustic wave device according to a modification of the seventh example embodiment of the present invention.

The acoustic wave device 70 is not limited to the configuration in which the first acoustic wave resonator 1A and the second acoustic wave resonator 1B are connected in parallel to each other. For example, in a modification of the seventh example embodiment illustrated in FIG. 13, the first acoustic wave resonator 1A and the second acoustic wave resonator 1B are connected in series to each other without any other elements interposed therebetween. In the present modification, the second excitation electrode 6 illustrated in FIG. 1 is connected to the first signal terminal 72 illustrated in FIG. 13. The fourth excitation electrode 8 is connected to the series-arm resonator S3 and the parallel-arm resonator P1. The wiring electrode 9 connects the first acoustic wave resonator 1A and the second acoustic wave resonator 1B. Also in the present modification, it is possible to reduce or prevent an unnecessary wave and to reduce or prevent a thermal stress.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device, comprising:

a first acoustic wave resonator including a piezoelectric substrate including a piezoelectric layer including a first main surface and a second main surface opposing each other, a first excitation electrode provided on the first main surface of the piezoelectric layer, and a second excitation electrode provided on the second main surface of the piezoelectric layer;

a second acoustic wave resonator sharing the piezoelectric substrate with the first acoustic wave resonator, and including a third excitation electrode provided on the first main surface of the piezoelectric layer, and a fourth excitation electrode provided on the second main surface of the piezoelectric layer; and a wiring electrode on the first main surface of the piezoelectric layer; wherein the first excitation electrode and the second excitation electrode oppose each other with the piezoelectric layer interposed therebetween, a region of the piezoelectric layer interposed between the first excitation electrode and the second excitation electrode is a first excitation region, the third excitation electrode and the fourth excitation electrode oppose each other with the piezoelectric layer interposed therebetween, a region of the piezoelectric layer interposed between the third excitation electrode and the fourth excitation electrode is a second excitation region;

the piezoelectric substrate includes one or more acoustic reflectors overlapping the first excitation region and the second excitation region in a plan view;

each of the first excitation electrode and the third excitation electrode is provided individually, and the wiring electrode connects the first excitation electrode and the third excitation electrode;

a portion of the wiring electrode overlapping a portion between the first excitation electrode and the third excitation electrode in the plan view includes a step portion;

the step portion is located on a side of the wiring electrode that is opposite to a side of the wiring electrode on which the piezoelectric layer is located; and a material of the wiring electrode is different from a material of at least one of the first excitation electrode and the third excitation electrode.

2. The acoustic wave device according to claim 1, wherein the piezoelectric substrate includes an insulating layer; and of the first main surface and the second main surface of the piezoelectric layer, the first main surface is located closer to the insulating layer than the second main surface.

3. The acoustic wave device according to claim 2, wherein the first excitation electrode, the third excitation electrode, and the wiring electrode are embedded in the insulating layer.

4. The acoustic wave device according to claim 1, wherein a thickness of the wiring electrode is larger than a thickness of the first excitation electrode, and is larger than a thickness of the third excitation electrode.

5. The acoustic wave device according to claim 4, wherein the wiring electrode extends to a surface of the first excitation electrode adjacent to the acoustic reflectors and a surface of the third excitation electrode adjacent to the acoustic reflectors.

6. The acoustic wave device according to claim 1, wherein a thickness of the wiring electrode is equal to or less than a thickness of the first excitation electrode, and is equal to or less than a thickness of the third excitation electrode.

7. The acoustic wave device according to claim 6, wherein each of the first excitation electrode and the third excitation electrode includes a plurality of electrode layers; and the wiring electrode at least connects one of the plurality of electrode layers of the first excitation electrode closest to the piezoelectric layer and one of the plurality of electrode layers of the third excitation electrode closest to the piezoelectric layer.

8. The acoustic wave device according to claim 1, wherein the acoustic reflectors include a first acoustic reflector overlapping the first excitation region in the plan view, and a second acoustic reflector overlapping the second excitation region in the plan view; and each of the first acoustic reflector and the second acoustic reflector is provided individually.

9. The acoustic wave device according to claim 8, wherein the wiring electrode does not overlap the first acoustic reflector and the second acoustic reflector in the plan view.

10. The acoustic wave device according to claim 1, wherein each of the acoustic reflectors includes a cavity portion in the piezoelectric substrate.

11. The acoustic wave device according to claim 10, wherein a gap is defined between the wiring electrode and the cavity portion.

12. The acoustic wave device according to claim 1, wherein the wiring electrode includes a plurality of wiring electrode portions made of materials different from each other.

13. The acoustic wave device according to claim 1, wherein one of the acoustic reflectors overlaps both of the first excitation region and the second excitation region in the plan view.

14. The acoustic wave device according to claim 1, wherein the acoustic reflectors are each an acoustic reflective film provided in the piezoelectric substrate.

15. The acoustic wave device according to claim 1, wherein any one of lithium tantalate, lithium niobate, or aluminum nitride is included as a material of the piezoelectric layer.

16. The acoustic wave device according to claim 1, further comprising:

one or more resonators other than the first acoustic wave resonator and the second acoustic wave resonator;

a signal terminal; and a ground terminal; wherein the first acoustic wave resonator and the second acoustic wave resonator are connected in parallel to each other; and the wiring electrode is connected to any one of the resonators other than the first acoustic wave resonator and the second acoustic wave resonator, the signal terminal and the ground terminal.

17. The acoustic wave device according to claim 1, further comprising:

one or more resonators other than the first acoustic wave resonator and the second acoustic wave resonator; wherein the first acoustic wave resonator and the second acoustic wave resonator are connected in series with each other.

18. The acoustic wave device according to claim 1, wherein the first excitation region and the second excitation region each have a circular or substantially circular shape in the plan view.

19. The acoustic wave device according to claim 1, wherein a material of the wiring electrode is different from a material of the first excitation electrode and a material of the third excitation electrode.

20. The acoustic wave device according to claim 1, wherein the acoustic wave device is a ladder filter or a transmission filter.

* * * * *